United States Patent [19]

Casey

[11] Patent Number: 4,823,357

[45] Date of Patent: Apr. 18, 1989

[54] DIFFRACTION LIMITED DICHROIC COMBINER DIODE LASER

[75] Inventor: William L. Casey, Warren County, Mo.

[73] Assignee: The United States of America as represented by the Secretary of the Air Force, Washington, D.C.

[21] Appl. No.: 928,356

[22] Filed: Nov. 10, 1986

[51] Int. Cl.[4] .............................................. H01S 3/08
[52] U.S. Cl. ..................................... 372/92; 350/174; 350/162.19; 350/311; 350/317; 372/50; 372/94; 372/97; 372/98; 372/99; 372/29; 372/20; 372/32
[58] Field of Search ............. 350/174, 162.11, 162.19, 350/169, 171, 172, 311, 313; 372/20, 23, 99, 50, 92, 93, 94, 97, 98; 357/19

[56] References Cited

U.S. PATENT DOCUMENTS

| | | | |
|---|---|---|---|
| 2,945,958 | 7/1960 | Morris | 250/230 |
| 3,107,296 | 10/1963 | Hine | 250/42 |
| 3,232,164 | 2/1966 | Kern et al. | 88/14 |
| 3,310,753 | 3/1967 | Burkhalter | 331/94.5 |
| 3,501,223 | 3/1970 | Rack | 350/171 |
| 3,541,468 | 11/1970 | Hammond, Jr. et al. | 331/94.5 |
| 3,577,093 | 5/1971 | Simpson | 331/94.5 |
| 3,633,123 | 1/1972 | Marcatili | 331/56 |
| 3,743,383 | 7/1973 | Giallorenzi | 350/170 |
| 3,763,441 | 10/1973 | Roess | 372/97 |
| 3,808,428 | 4/1974 | Barry et al. | 250/199 |
| 3,835,414 | 9/1974 | Ahearn | 331/94.5 |
| 3,920,983 | 11/1975 | Schlafer et al. | 250/199 |
| 3,924,937 | 12/1975 | Munroe et al. | 350/285 |
| 3,953,727 | 4/1976 | d'Auria et al. | 250/199 |
| 3,986,130 | 10/1976 | Soures et al. | 330/4.3 |
| 4,073,572 | 2/1978 | Avicola | 350/174 |
| 4,103,254 | 7/1978 | Chikami | 372/32 |
| 4,163,954 | 8/1979 | Hayes | 332/7.51 |
| 4,174,150 | 11/1979 | Congleton | 350/174 |
| 4,309,671 | 1/1982 | Malyon | 331/94.5 S |
| 4,311,360 | 1/1982 | Hodson et al. | 350/174 |
| 4,344,671 | 8/1982 | Lang | 350/174 |
| 4,406,003 | 9/1983 | Eberly et al. | 370/3 |

FOREIGN PATENT DOCUMENTS

56-150887  11/1981  Japan .

OTHER PUBLICATIONS

D. M. Robinson and C. W. Rowland, "Optically Coupling Tunable Diode Lasers", NASA Tech. Briefs, vol. 4, No. 1, Spring 1979, p. 49.

*Primary Examiner*—William J. Sikes
*Assistant Examiner*—Georgia Y. Epps
*Attorney, Agent, or Firm*—William G. Auton; Donald J. Singer

[57] ABSTRACT

A laser transmitter is disclosed in which the laser combines the outputs of numerous laser diodes using dichroic combination to produce a high power, diffraction limited beam which may be transmitted at minimum beam divergence using the full aperture of the transmitter telescope. The individual diode beams are combined and superimposed in the laser, and are transmitted superimposed in the near and far field of the transmitter telescope. The dichroic combining process is as follows. A collimate beam of a first wavelength is directed at a narrowband or long wave pass filter which is tilted slightly (about 10 degrees). This beam passes through the filter. A beam of a second wavelength is directed toward the exit side of the filter (which acts as a mirror) at such an angle that the second beam is reflected colinear with the first beam and superimposed on it. This process of superimposing the laser beams continues as each laser beam from the laser diodes is added to form a combined laser beam. Before transmission, a sample is extracted from the combined laser beam, and filtered at the discrete wavelengths of the laser diodes to determine if each of the laser diodes needs to be adjusted. When necessary, the laser diodes are thermally adjusted so that their laser beams are at their specific discrete wavelength.

5 Claims, 4 Drawing Sheets

DIFFRACTION LIMITED DICHROIC COMBINER DIODE LASER

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to laser communication systems, and more specifically to a laser transmitter which uses dichroic combination to combine the output beams of numerous diode lasers into a single diffraction-limited beam.

The laser beams of spaceborne laser communication systems must travel great distances (100 to 1,000 miles) in links involving space platforms. To achieve adequate signal margins for acquisition, track, and communication the beams must be focussed very sharply with minimum beam divergence so that the received beam appears to be its brightest (maximum irradiance). The optimum condition occurs when a full aperture beam is emitted from a near perfect (diffraction limited) telescopic optical system. If the source laser produces a near perfect beam, a diffraction limited telescope can project the laser beam into the brightest possible signal at the receiver.

One candidate being considered as a laser source is the laser diode. Laser diodes are small, efficient, and their low voltage drive requirements are compatible with the signal levels available from highly reliable solid state circuit components. In the design of a laser transmitter these features are important because they result in decreased system size and weight, reduced cooling and electrical requirements, and increased overall system reliability.

The favorable mechanical and electrical characteristics of laser diodes are complemented by a number of useful optical properties. The operating wavelength of a laser diode may be accurately tuned over a broad range by controlling either the diode temperature or drive current. Also, the output power of a laser diode may be directly modulated at frequencies up to several gigahertz by modulating the diode drive current. Separate modulator crystals and high voltage drive electronics are not required. Of particular importance is that laser diodes can be made to provide a single axial mode output. They are also highly polarized, a property which would be useful in combining, separating, or isolating signals.

The most serious opertional shortcoming of single mode laser diodes is the low output power levels which are now available—typically less than 50 milliwatts continuous wave (c.w.) signals. Undoubtedly, this limitation has in the past prevented the use of laser diodes in space related applications. Full utilization of the potential of laser diodes for free-space communications depends on the development of an effective method of increasing the power available in a near-diffraction limited beam. There are two approaches to this problem. One approach is to develop new diode designs which can provide higher single mode power while maintaining a long lifetime. Current research is directed at this approach and single mode diode power levels are increasing each year. It seems unlikely, however, that substantial increases beyond a factor of two or three will occur in the near-future due primarily to power density limitations.

A solution to the low output power drawback of diode lasers is suggested by the following U.S. Patents, the disclosures of which are incorporated by reference:

U.S. Pat. No. 3,808,428 issued to Barry et al;
U.S. Pat. No. 3,835,414 issued to Ahearn;
U.S. Pat. No. 3,920,983 issued to Schlafer et al
U.S. Pat. No. 3,953,727 issued to d'Auria et al; and
U.S. Pat. No. 4,406,003 issued to Eberly et al.

The d'Auria et al patent is pertinent for its disclosure of a transmitting and receiving system with independent communication channels in a single optical fiber. A plurality of laser diodes supply infrared rays of different wavelengths to respective ones of a series of selective mirrors. The mirrors are tilted at a 45 degree angle and downstream beams are directed to the exit sides of the mirrors where they are reflected and combined with the beams passing through from the upstream sides of the mirrors. In this way, the light radiation from the diodes is multiplexed to the single fiber.

Schlafer et al also discloses a multi-channel optical communications system which provides simultaneous optical communications over a plurality of different, non-interfering wavelengths. The device of this patent uses as a source a multiwavelength dye laser to provide a plurality of optical carriers in a single beam.

Eberly et al provide an optical communications system which uses pulses of different wavelength and/or polarization. Ahearn shows a gallium arsenide laser diode array.

Barry et al disclose a satellite laser communications system including a telescope.

While the above-cited references are instructive, the need remains to provide a solution to the low output power drawback of diode lasers so that they are suitable for use in spaceborne laser communications systems. The present invention is intended to satisfy that need.

SUMMARY OF THE INVENTION

The present invention is a laser transmitter which combines numerous single longitudinal mode diodes using dichroic combination to produce a high power, diffraction limited beam which may be transmitted at minimum beam divergence using the full aperture of a transmitter telescope.

One embodiment of the present invention is a laser transmitter composed of: six diode lasers, five narrow band filters, a 2% beam splitter, a variably tilted interference filter, a photodiode detector, and a wavelength controller circuit. In this embodiment, the output beams of six diodes are sequentially added by the successive transmission through (and subsequent reflection from) the five narrowband filters. Each of the narrowband filters superimposes and collimates received laser beams to produce a combined laser beam as follows. The first diode laser produces a collimated beam of a first wavelength, which is directed at a narrowband or long wave pass filter that is tilted slightly (about 10 degrees). This beam passes through the filter. A beam of a second wavelength from the second diode laser is directed toward the exit side of the filter (which acts as a mirror) at such an angle that the second beam is reflected colinear with the first beam and superimposed on it. Each of the subsequent narrowband filters perform a dichroic combination of received laser beams by superimposing each subsequent laser beam onto the combined laser beam. This combined laser beam is sampled by the 2% beam splitter which outputs 98% of the combined laser beam while forwarding a 2% sample laser beam to the tilted interference filter.

The tilted interference filter produces filtered sample beams by adjustably filtering the sample laser beam into the wavelengths ideally produced by each of the diode lasers. These filtered sample beams are received by the photodiode detector. The photodiode detector is a commercially available photodiode which monitors the optical power of the filtered sample laser beams by being operated in the photovoltaic mode, and detecting the center wavelengths ideally produced by each of the diode lasers. The photodiode detector produces detection signals which indicates whether the diode lasers need to be adjusted.

The detection of the signals of the photodiode are received by the wavelength controller circuit which responds by producing adjustment signals to each diode laser, as required to adjust the wavelengths of the laser beams produced by them. In this particular embodiment, the adjustment signals adjust the wavelengths of the laser diodes by producing minute changes in the operating temperatures of the laser diode.

It is an object of the present invention to provide a laser transmitter system which uses multiple diode lasers to produce a high power, diffraction limited laser beam.

It is another object of the present invention to provide dichroic combining of multiple laser beams, using narrowband interference filters.

It is another object of the present invention to multiplex and number of laser beams into a combined beam, and to demultiplex a sample of the combined beam by filtering to provide active wavelength control of each individual laser source.

These objects together with other objects, features and advantages of the invention will become more readily apparent from the following detailed description when taken in conjunction with the accompanying drawings wherein like elements are given like reference numerals throughout.

DESCRIPTION OF THE PREFERRED EMBODIMENT

The present invention provides the dichroic combination of the outputs of numerous longitudinal diode lasers into a single, combined laser beam.

Figure 1:
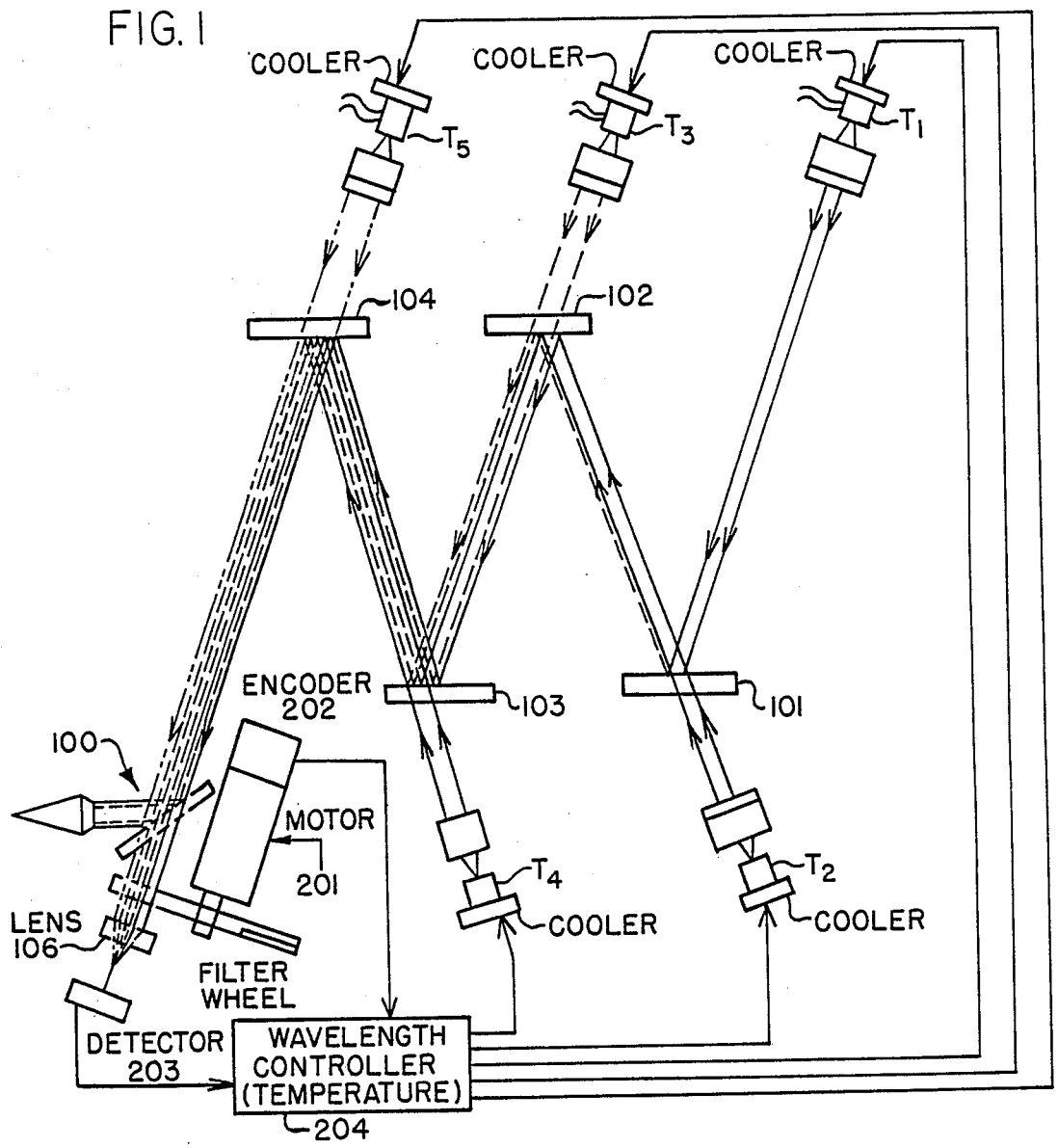
FIGS. 1 and 2 are illustrations of two embodiments of the present invention.

The reader's attention is now directed towards FIG. 1, which is an illustration of the multireflection dichroic combiner laser of the present invention. The system of FIG. 1 uses: five diode lasers $T_1$-$T_5$, four narrow band filters 101-104, a 2% beam splitter 100, an interference filter 201, a detector 203, and a wavelength controller circuit 204.

The diode laser sources $T_1$-$T_5$ may be commercially available GaAs or GaAlAs diode lasers or diode laser arrays with output ranges from 8,000 to 8,8000 angstroms. The diode lasers $T_1$-$T_5$ respectively output $\lambda_1$-$\lambda_5$ laser beams with center wavelengths spaced 20 angstroms apart for a total bandpass of less than 100 angstroms.

The narrowband filters are also commercially available, and have the following characteristics: band pass=30 angstroms; reflectivity=95%, and transmissivity=92%. In the present invention the narrowband filters 101-104 are used for the dichroic combination of laser beams $\lambda_1$-$\lambda_5$ as follows.

Light from $T_1$ diode is collimated by a diffraction limited lens and directed towards filter 101. Filter 101 has a bandpass is such that $\lambda_1$ light reflects from it while light from diode $T_2$ is transmitted. The filters 101-104 are stepped in their center bandpass in 20 angstrom increments, and each diode's light in turn is transmitted by its own filter only to be reflected by each subsequent filter in the sequence.

As depicted in FIG. 1, each filter is tilted slightly (about 10 degrees) with respect to a plane normal to the incident laser beams. The 95% reflectivity of filter 101 reflects the $\lambda_1$ light of laser $T_1$, while the 92% transmissivity of filter 101 superimposes the $\lambda_2$ light onto the $\lambda_1$ light. Similarly, the reflectivity of filter 102 reflects the $\lambda_1$ and $\lambda_2$ beams while its 92% transmissivity superimposes the $\lambda_3$ light from laser diode $T_3$ onto the $\lambda_1$ and $\lambda_2$ beams. This process continues until the last narrowband filter 104 outputs a combined beam which includes the beams from all the $T_1$-$T_5$ laser diodes.

The combined laser beam produced by the last narrowband filter 104 is output and sampled by the 2% beamsplitter 100. This is also a commercially available optical element, and need not be described other than to observe that it outputs 98% of the combined laser beam while forwarding a 2% sample laser beam to the tilted interference filter 201.

The tilted interference filter 201 is also a commercially available device which produces filtered samples beams by adjustably filtering the sample laser beam into the wavelengths ideally produced by each of the diode lasers $T_1$-$T_5$. These filtered sample beams are received by the photodiode detector 203.

The photodiode detector 203 is a Hewlett-Packard photodiode which is operated in the photovoltiac mode to monitor the optical power of the filtered sample laser beams from the tilted interference filter 101. The photodiode detector 203 is set to detect the center wavelengths ideally produced by each of the diode lasers $T_1$-$T_5$, and produce detection signals which indicate whether the diode lasers need to be adjusted.

The detection signals of the photodiode detector 203 are received by the wavelength controller circuit 204 which responds by producing adjustment signals to each diode laser, as required to adjust the wavelengths of the laser beams produced by them. In this particular embodiment, the adjustment signals adjust the wavelengths of the laser diodes by producing minute changes in the operating temperature of the laser diode. The wavelength controller circuit and the process of thermal adjustment of the laser diodes is discussed in detail below.

Figure 2:
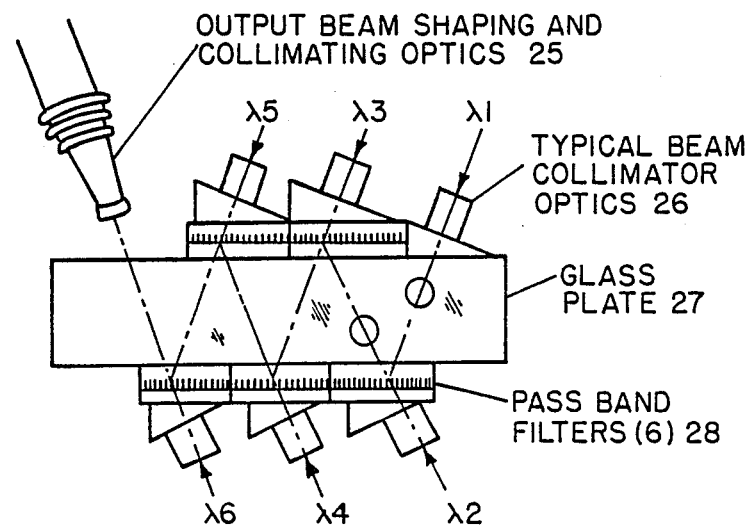

FIG. 2 is a schematic of another embodiment of the present invention, in which the output beams $\lambda_1$-$\lambda_6$ of six diodes is sequentially added by the successive transmission and subsequent reflection by five narrowband filters. The purpose of FIG. 2 is to illustrate an example of a finished dichroic combining system and to emphasize that the system of FIG. 1 is just an example of the present invention. More specifically, the system of FIG. 2 is used to introduce FIG. 3 which is a chart of the measured filter transmissions for $\lambda_1$–$\lambda_6$ of the laser beams of FIG. 2.

Figure 3:
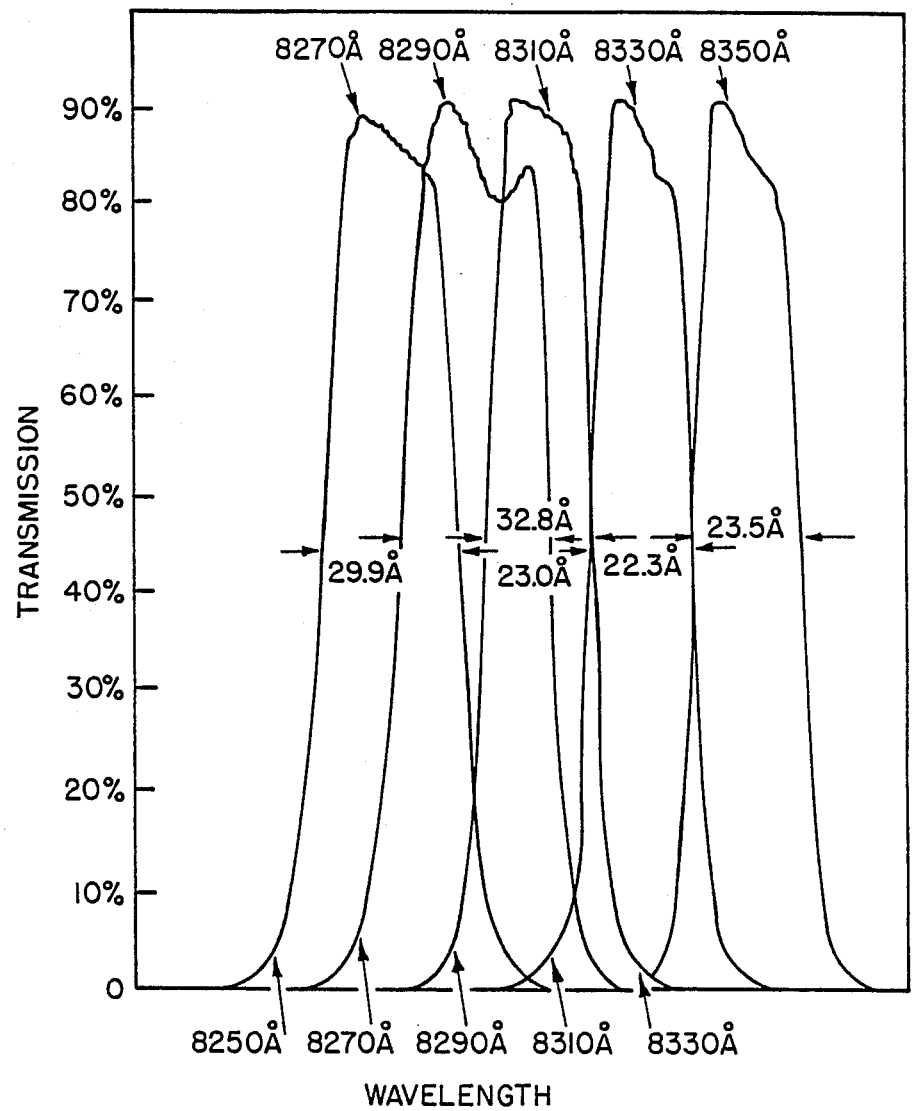
FIG. 3 is a chart of the measures of the filtered outputs of the laser sources of FIG. 2.

FIG. 3 is meant to serve as a guideline for the operating characteristics of the laser diodes used in the invention. Progressive summing occurs from shorter to longer wavelengths. The GaAlAs diodes of FIG. 1 and 2 are capable of wavelengths ranging from 8,000 to 8,800 angstroms, but are set with wavelength separations of 20 angstroms, as illustrated in FIG. 3. The dichroic summing of the present invention is possible because of the availability of narrowband interference filters with extremely sharp transmission/reflection transitions. Narrowband interference filters are used instead of long or short wavelength bandpass filters because much steeper transmission slopes are available. The measured transmission curves of the five filters are shown in FIG. 3. The peak transmission of the mounted filters is close to 90% while the reflection efficiency is about 95%.

To achieve the required performance, each diode must run with nearly all of its power confined to the assigned passband. Actually, although diode spacing is 20 angstroms, the target passband for each diode is about 10 angstroms wide since operation outside this band results in unacceptable reflection and transmission losses at the adjacent passband interface.

For the system of FIG. 2 to achieve dichroic combining, the diode beams must be collimated. A diffracion limited collimating lens is required if the diode wavefront quality is to be maintained. The combiner arrangement of FIG. 2 uses narrow bandpass filters bonded onto a high quality BK-7 glass block whose filter faces are precisely parallel. The laser diode collimated beams are tilted slightly with respect to the narrowband filters to provide beam translation along the block providing adequate spacing between adjacent diode collimator assemblies. If the beam tilt relative to the filters is held to 15 degrees or less, little polarization effect is realized and the inherently strong diode linear polarization is maintained. For this laser, 10 degrees was chosen as the angle of incidence.

The collimator lens numerical aperture, in the system of FIG. 2, was chosen to accept the most divergent diode beam, 68.5 degrees full angle at the $1/e^2$ point. The lens selected, at a numerical aperture of 0.6, will accept energy up to 73.7 degrees full angle. The lens was supplied by Optics Plus, Inc., using a model LDCO-62 diode collimator lens which was modified to accommodate the etalon in the back focal space and include an Invar barrel. The design is operable over a broad spectral operating range of 633 to 905 nm. The field of view is 30 milliradians and, as analyzed by ray tracing, the RMS wavefront error is one twenty-third wave over the field. Interferometric testing of the diode-etalon-lens combination showed total wavefront error of better than one-sixteenth wave verifying the diffraction limited lens image quality.

The filters in FIG. 2 are bonded to the glass combiner block using an index matching cement. The glass combiner block, supplied by Muffoletto Optical Co., is thermally controlled by upper and lower surface thermofoil heaters which control the block to a preset value within 0.2° C. This control is done for two reasons. First the narrowband filters are held at a constant temperature although they do not require a high degree of thermal control precision since their temperature coefficient (wavelength) is +0.22 angstroms per degree C. Second, and more important, negligible thermal gradients are maintained in the block to assure minimal wavefront degradation as the beams traverse the block. The wavefront variation in a single traverse of the block is 0.0067 waves rms for a gradient of 0.02° C., which is negligible.

Figure 4:
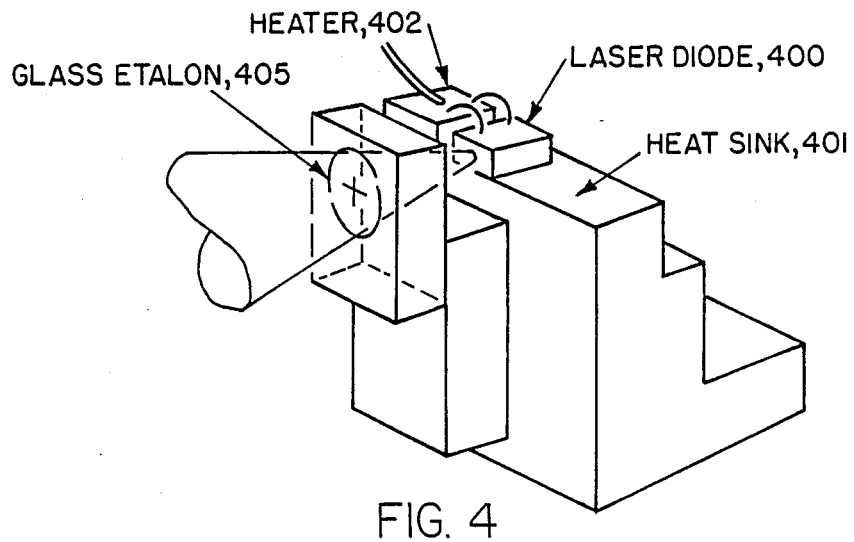
FIG. 4 is a view of a thermal adjusting element which is placed in proximity to a laser diode.

As mentioned in the discussion of FIG. 1, the wavelength of each laser diode may also be actively controlled by adjusting the diode junction temperature using a thermo-electric cooler for each diode. Another technique is depicted in FIG. 4, in which each laser diode 400 is mounted on a copper heat sink 401. A thermistor 402 is mounted adjacent to the laser diode and functions as a heater to allow thermal control of the wavelengths of the laser diode 400.

Also attached to the laser diode 400 is a glass etalon 405. This is a driver which supplies current to the 120 ohm thermistor 402. A schematic of an etalon driver circuit is depicted in FIG. 5.

Figure 5:
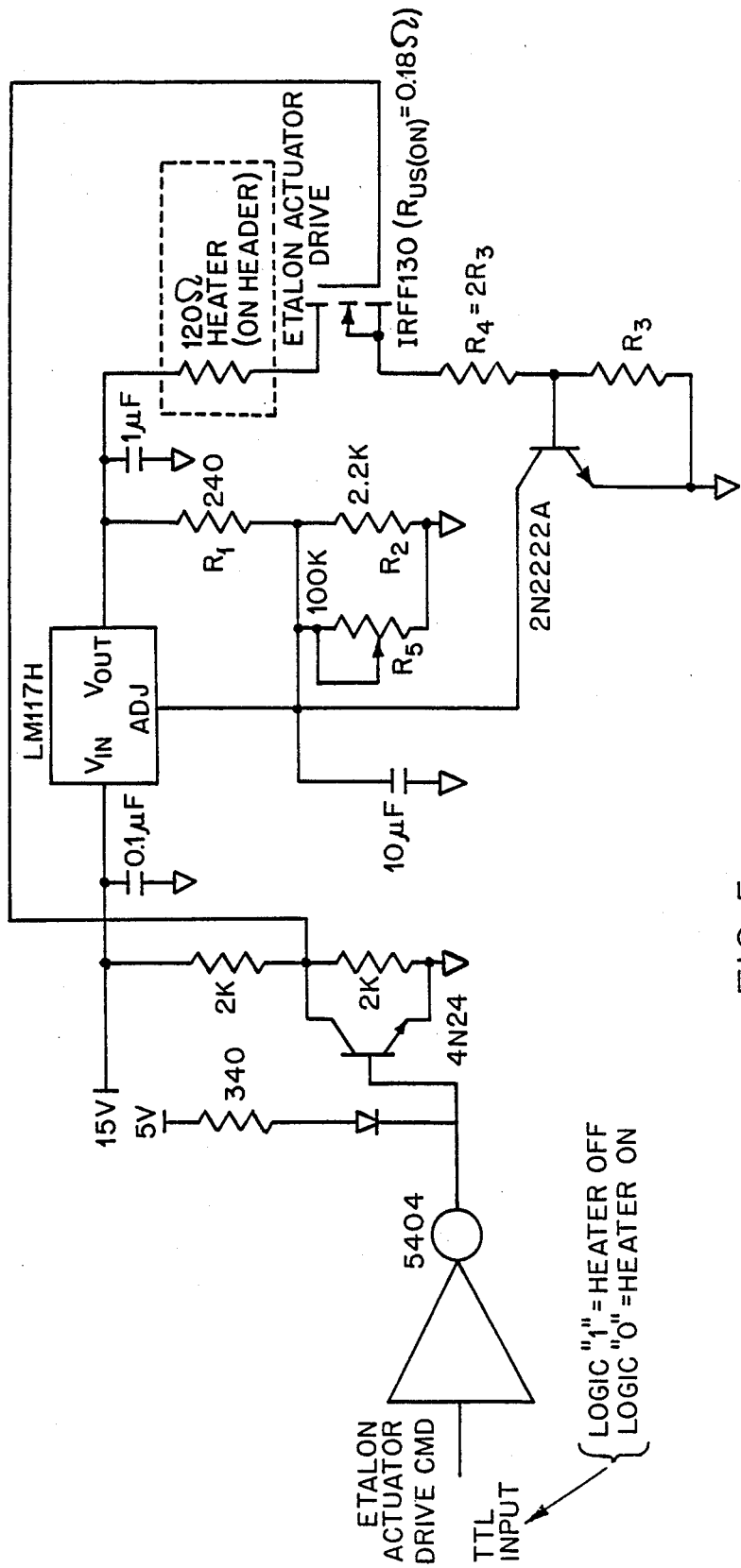
FIG. 5 is an electrical schematic of the driver circuit which controls the thermal adjusting element depicted in FIG. 4.

The etalon driver circuit of FIG. 5 receives a logic "1" to turn the heater off, and a logic "0" to turn the heater on. Since each of the diodes operates at different wavelengths, they are held at different temperatures. The 120 ohm diode heater in FIG. 5 is activated to keep its laser diode at the appropriate operating temperature. An example of a temperature distribution between three GaAlAs diodes that produces the 20 angstrom separation is: 16° C. (60.8° F.), 20° C. (68.0° F.), and 24° C. (75.2° F.). All the dichroic filters in the combiner block of FIG. 2 are designed for operation at 24° C., but each design will change depending upon the type of diode laser selected.

Returning to the system of FIG. 1, the detector 203 was identified as a commericially available photodiode obtained from Hewlett-Packard. The tilted interference filter 201 is a commercially available spike filter which is electrically connected with an ITEK 15 bit optical encoder 202, and which has the spike filter characteristics presented below in Table 1.

TABLE 1

| SPIKE FILTER CHARACTERISTICS | |
|---|---|
| CENTER WAVELENGTH | 837 NM ± 0.5 NM @ NORMAL INCIDENCE |
| BANDPASS (FWHM) | 2.0 A ± 0.5 A |
| TRANSMISSION | 50% |
| CAVITY DESIGN | SINGLE |
| BLOCKING | SPIKE ONLY $10^{-3}$ ON EITHER SIDE |
| SIZE | 12.5 MM DIA. ± 0.25 MM 0.150 IN. ± 0.010 IN. THICK |
| WAVELENGTH TEMP. COEFFICIENT | +0.21 A/C° |
| SEALING | HERMETIC-ANODIZED AL. RING |
| COATINGS | A-R ($MgF_2$) @ 830 NM BOTH SIDES |
| OPTICAL QUALITY | 2 WAVES IN TRANSMISSION |
| ANGLE OF INCIDENCE | 0 TO 20° MAX. |

Figure 6:
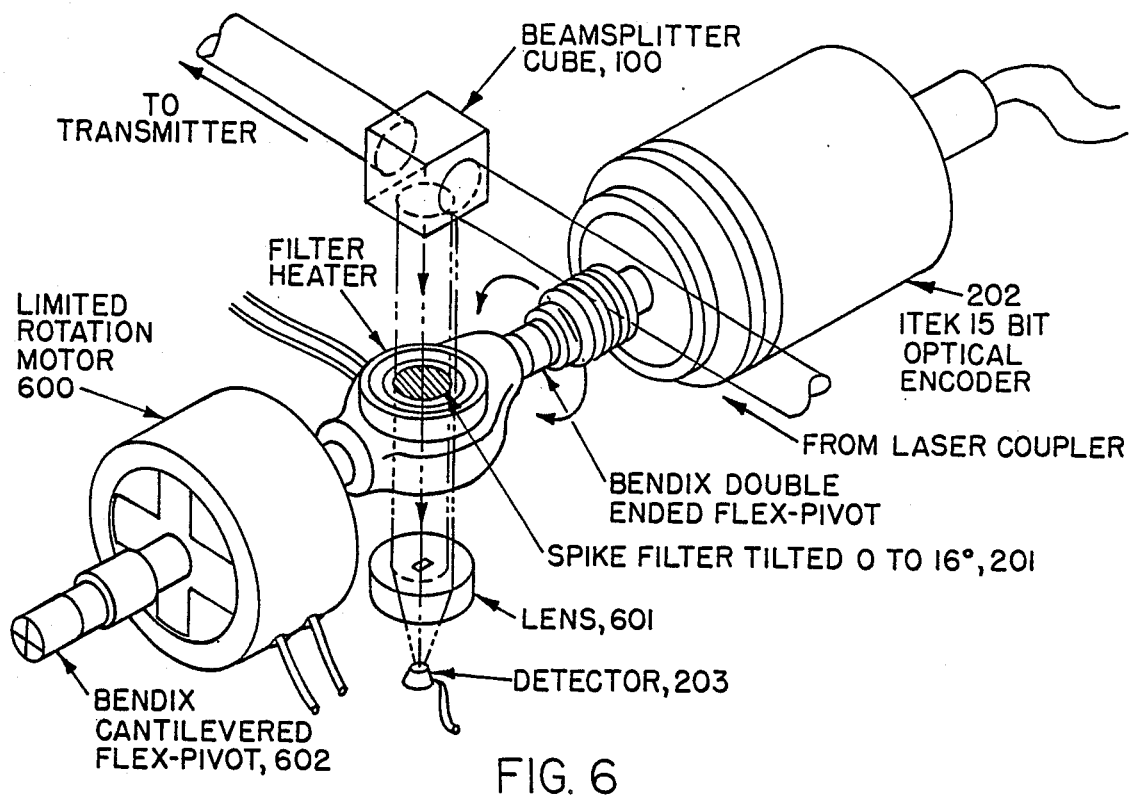
FIG. 6 is a detailed illustration of the beamsplitter, optical encoder and tilted filter of the system of FIG. 1.

FIG. 6 is an illustration of the beam splitter 100, optical encoder 202, spike filter 201 and detector 203 used in the embodiment of FIG. 1. As mentioned in the discussion of FIG. 1, the beam-splitter 100 is used to direct a small percentage of the laser power from the main beam onto the tilting filter 201. Angular orientation of the tilting filter is accomplished through direct drive by an Aeroflex brushless D.C. limited rotation motor (LRM) 600. Bendix flex-pivots of the type used in torque motor beam steerers are used as bearings. The tilting filter 201 produces filtered sample beams by filtering the sample laser beam into the wavelengths ideally produced by each of the laser diodes. Examples of expected wavelength values are given in the chart of FIG. 3. The the filtered sample beams are received by the photodiode detector 203 which produces detector signals which indicate whether the diode lasers need to be adjusted.

The detection signals of the photodiode 203 are received by a wavelength controller circuit which responds by producing adjustment signals to each diode laser, to adjust the wavelengths of the laser beams produced by them. When the wavelength control is produced by maintaining each laser diode at a specified temperature, then the wavelength controller circuit for each diode laser consists of the etalon driver circuit depicted in FIG. 5. As discussed above, the 120 ohm heater remains off as long as the circuit is receiving a logic "1" from the photodiode detector. When the laser beam for a particular wavelength falls below a threshold, the photodiode detector 203 ceases to produce an output that particular etalon driver circuit. The result is that the 120 ohm heater is activated to drive the laser diode back up into its operating temperature range (until the photodiode detector begins detecting sufficient light to produce a logic "1" detection signal.

Figure 7:
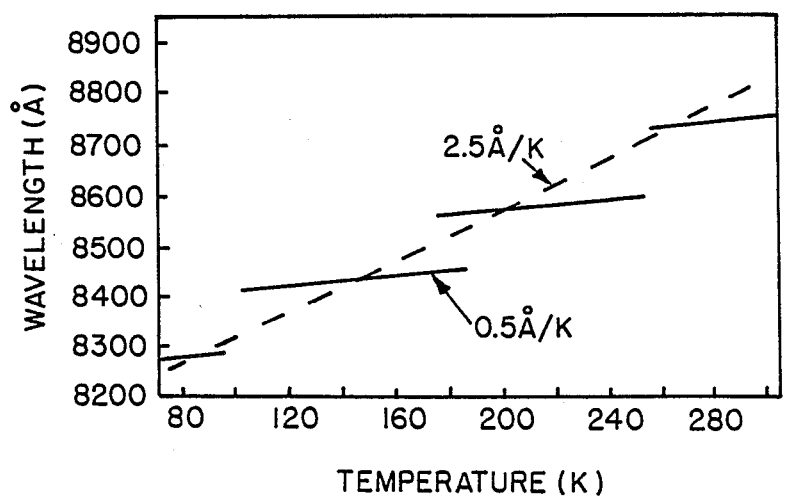
FIG. 7 is a chart depicting the temperature dependence of the lasing wavelengths of a laser.

Note that the temperature dependence of the lasing wavelength of the laser diodes is a phenomenon that is well known in the art. For an example see the IEEE Journal of Quantum Electronics, Vol. QE-21, No. 6, June 1985, from which FIG. 7 was obtained. FIG. 7 is a chart depicting the discrete lasing wavelengths emitted by a laser diode under different temperature ranges. The present invention takes advantage of this phenomenon to tune the diode lasers to emit discrete wavelengths.

A variety of alternatives currently exist in the art which are suitable for use as the wavelength control circuit in the present invention. For example, in the system of FIG. 1, the wavelength of each diode is actively controlled by controlling the junction temperature using a thermo-electric cooler for each diode. The sensing of the wavelength of each diode may also be performed at the summed output of the laser by spectrally scanning with a filter wheel, or the variably tilted interference filter described above. Alternatively, the wavelength may be sensed at the diode output using two overlapping narrowband interference filters, one centered slightly above and the other slightly below the desired center wavelength of the diode. The back of each filter, in such a system, would contain a separate photodetector. The sum and difference signals of the two detectors would provide feedback to actively control the diode wavelength keeping it positioned in its bandpass.

The output of the laser of the present invention is diffraction limited, and produces the brightest possible far field pattern. The output may be circularized by use of a single group of anamorphic optics and subsequently combined with another combined beam using a polarization beam combiner, thereby doubling the laser output in the same overall bandpass.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A laser transmitter system comprising:
   a plurality of laser sources, emitting laser beams with discrete wavelengths;
   a means for superimposing the laser beams received from the laser sources to produce a combined laser beam wherein said superimposing means comprises a plurality of narrowband filters which intercept and combine the laser beams from the plurality of laser sources, each of said narrowband filters having a body with a transmissivity of about 92%, each of said narrowband filters being aligned, with a tilt of about 10 degrees, with two of said laser sources such that the laser beams of a first laser source are conducted through the body of the narrowband filter to join with the laser beams of a second laser source, said laser beams of said second laser source being reflected off a reflective side of the narrowband filter to join with the laser beams of said first laser source, said plurality of narrowband filters thereby superimposing and combining the laser beams of all the laser sources so that they are aligned in parallel and superimposed into the combined laser beam;
   a means for sampling said combined laser beam received from said superimposing means at said discrete wavelengths, said sampling means producing output signals which indicate when one of said plurality of laser sources ceases to emit at its discrete wavelength, said sampling means splitting said combined laser beam from said plurality of narrowband filters to output said combined laser beam and a sample of said combined laser beam so that said sample may be photodetected to produce said output signals; and
   a means for adjusting said laser sources, said adjusting means receiving the output signals from said sampling means and responding by adjusting the laser sources so that they emit their laser beams at their discrete wavelengths by producing minute changes in operating temperatures around said laser sources.

2. A laser transmitter system, as defined in claim 1, wherein said sampling means comprises:
   a beam splitter which receives and splits said combined laser beam from said plurality of narrowband filters, said beam splitter thereby outputting said sample of said combined laser beam;
   a tilted interference filter which receives and filters, at the discrete wavelengths of the laser sources, the sample of said combined laser beam from said beam splitter, said tilted interference filter thereby outputting filtered samples at said discrete wavelengths; and
   a means for detecting photovoltage, said detecting means receiving and detecting said filtered samples at said discrete wavelengths and outputting detecting signals to said adjusting means to indicate when each of said plurality of laser sources need adjusting.

3. A laser transmitter system, as defined in claim 2, wherein said detecting means comprises a photodiode which receives and detects said filtered samples from said tilted interference filter to produce output signals which are a logic "1" when said filtered samples have sufficient photovoltage at said discrete wavelengths, said photodiode producing output signals which are a logic "0" when said filtered samples at said discrete wavelengths have insufficient photovoltage, said photodiode thereby providing an indication to said adjusting means of any need to adjust said laser sources.

4. A laser transmitter, as defined in claim 3, wherein each of said plurality of laser sources comprises a laser diode which emits a laser beam at one of said discrete wavelengths which is spaced at least twenty angstroms from all other discrete wavelengths.

5. A laser transmitter system, as defined in claim 4, wherein said adjusting means comprises:

a plurality of thermal resistors which are each fixed in proximity to one of said plurality of laser sources to adjust the laser beams into said discrete wavelengths by heating said laser diode and thermally adjusting the discrete wavelength of the laser beams produced by it; and a wavelength controller circuit which is electrically connected with the photodiode and with each of the plurality of thermal resistors, said wavelength controller circuit activating each of the thermal resistors to thermally adjust its associated laser diode in response to the output signals of the photodiode.

* * * * *